United States Patent
Lee et al.

(10) Patent No.: US 8,901,528 B2
(45) Date of Patent: Dec. 2, 2014

(54) PHASE-CHANGE RANDOM ACCESS MEMORY AND METHOD OF MANUFACTURING THE SAME

(71) Applicant: SK Hynix Inc., Gyeonggi-do (KR)

(72) Inventors: Jin Ku Lee, Gyeonggi-do (KR); Min Yong Lee, Gyeonggi-do (KR); Jong Chul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/715,970

(22) Filed: Dec. 14, 2012

(65) Prior Publication Data
US 2014/0054533 A1    Feb. 27, 2014

(30) Foreign Application Priority Data
Aug. 24, 2012 (KR) .................. 10-2012-0093233

(51) Int. Cl.
*H01L 29/02*    (2006.01)
*H01L 45/00*    (2006.01)
*H01L 27/24*    (2006.01)

(52) U.S. Cl.
CPC ............ *H01L 45/00* (2013.01); *H01L 45/144* (2013.01); *H01L 45/06* (2013.01); *H01L 27/2409* (2013.01)
USPC ..... 257/2; 257/3; 257/4; 257/5; 257/E29.002; 438/102; 438/103; 438/104

(58) Field of Classification Search
USPC .................. 257/1–5, E29.002; 438/102–104
See application file for complete search history.

(56) References Cited

U.S. PATENT DOCUMENTS

2009/0072245 A1 *   3/2009   Noe et al. .................. 257/79

FOREIGN PATENT DOCUMENTS

| KR | 1020110005694 | 1/2011 |
| KR | 1020110106987 | 9/2011 |

* cited by examiner

Primary Examiner — Jami M Valentine
(74) Attorney, Agent, or Firm — IP & T Group LLP

(57) ABSTRACT

A PCRAM device and a method of manufacturing the same are provided. The PCRAM device includes a semiconductor substrate, and a PN diode formed on the semiconductor substrate and including a layer interposed therein to suppress thermal diffusion of ions.

16 Claims, 4 Drawing Sheets

PHASE-CHANGE RANDOM ACCESS MEMORY AND METHOD OF MANUFACTURING THE SAME

CROSS-REFERENCES TO RELATED APPLICATION

This application claims priority under 35 U.S.C. 119(a) to Korean application number 10-2012-0093233, filed on Aug. 24, 2012, in the Korean Patent Office, which is incorporated by reference in its entirety.

BACKGROUND OF THE INVENTION

1. Technical Field

Exemplary embodiments of the present invention relate to a phase-change random access memory (PCRAM) device and a method of manufacturing the same, and more particularly, to a PCRAM device including a diode and a method of manufacturing the same.

2. Related Art

PCRAM devices store data using a phase-change material, which is changed to a crystalline state or an amorphous state while the phase-change material is heated and cooled. That is, since the phase-change material has low resistance in the crystalline state and high resistance in the amorphous state, the crystalline state may be defined as SET or logic level "0" and the amorphous state may be defined as RESET or logic level "1".

As the phase-change material applied to the PCRAM devices, a chalcogenide compound (Ge—Sb—Te: GST) including germanium (Ge), antimony (Sb), tellurium (Te) has been mainly used. The crystalline state in the phase-change material such as GST may be changed by heat generated according to a current intensity and applied time.

The PCRAM devices may include a plurality of phase-change memory cells formed at intersections of word lines and bit lines. The phase-change memory cell includes a resistor of which a value is changed based on a through current and an access device configured to control the current provided to the resistor.

PNP bipolar transistors MOS transistors, or PN diodes may be used as an access device and the PN diodes occupied with a narrow area are mainly used as an access device of high-integrated PCRAM devices.

When the device is driven using the PN diode, current does not flow in an off current state and a large amount of current flows in on current state even in a lower voltage so that the PN diode provide stable operations for many cells.

However, leakage current occurs often in the off current state of the PN diode. Therefore, when a vertical PN diode is applied to suppress dopant diffusion in a fabrication process of a current RN diode, an undoped layer is applied to be interposed between P-type and N-type conductive layers. The dopant, movement due to thermal diffusion continuously occurs, and thus, leakage current in the off current state is increased.

Thus, a thickness of the undoped layer interposed between the P and N type conductive layers in the vertical PN diode is increased, but there is limitation to increase the height of the vertical PN diode. Reduction in the leakage current of the vertical PN diode is emerging as a main concern.

SUMMARY

In accordance with an embodiment of the present invention, the PCRAM device may include a semiconductor substrate, and a PN diode formed on the semiconductor substrate and including a layer interposed therein to suppress thermal diffusion of ions.

In accordance with another embodiment of the present invention, the method of manufacturing a PCRAM device may include providing a semiconductor substrate, and forming a PN diode pattern including a layer interposed therein to suppress thermal diffusion of ions, on the semiconductor substrate.

According to the exemplary embodiments of the inventive concept, the PCRAM device in which leakage current is reduced in an off current state of a diode by suppressing dopant movement of the diode may be provided.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
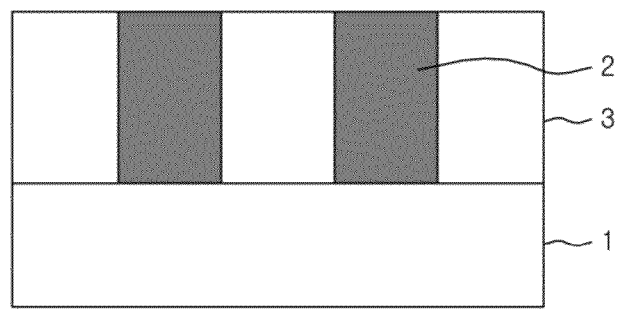
FIGS. 1 to 6 are cross-sectional views sequentially illustrating a method of manufacturing a PCRAM device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Hereinafter, a PCRAM device according to an exemplary embodiment of the inventive concept will be described with reference to FIGS. 1 to 6. FIGS. 1 to 6 are cross-sectional views of a PCRAM device according to an exemplary embodiment.

Referring to FIG. 1, a word line 2 is formed on a semiconductor substrate 1.

First, an interlayer insulating layer 3 is formed on the semiconductor substrate 1. A region of the interlayer insulating layer 3 is etched and a word line metal material is buried to form the metal word line 2 as a diode cell switching device.

Here, the word line 2 may be formed using a metal material capable of lowering a word line resistance such as titanium (Ti), titanium nitride (TiN), tungsten (W), or copper (Cu).

The interlayer insulating layer 3 may include a high density plasma (HDP) layer having dense film quality and interlayer planarization characteristic.

Figure 2:
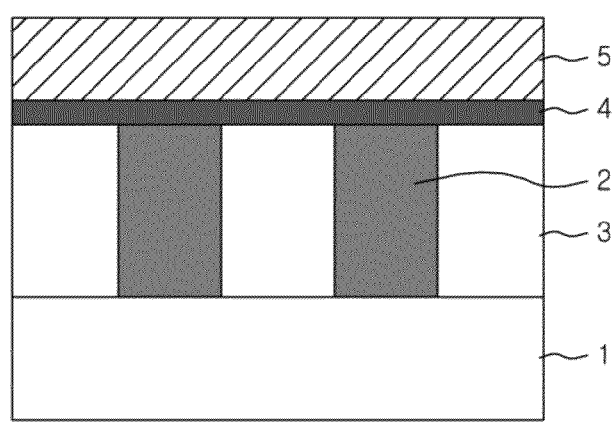

Referring to FIG. 2, a first polysilicon stack 5 of a PN diode is formed.

Specifically, a lower metal layer 4 is formed on the semiconductor substrate 1 including the word line 2 before the first polysilicon stack 5 is formed.

The lower metal layer 4 may reduce a contact resistance between the word line and the PN diode to be formed later and may prevent metal ions from being diffused into a diode depletion region.

The lower metal layer 4 may include a single material layer that includes Ti, TiN, W, tungsten nitride (WN), tungsten silicide (WSix) or tungsten silicon nitride (WSixN), or a combination layer thereof.

Further, the lower metal layer 4 may be formed through a deposition process, for example, sputtering, metalorganic atomic layer deposition (MOALD), physical vapor deposition (PVD), chemical vapor deposition (CVD), or the like.

The first polysilicon stack 5 may have a layer using an N type or P type element based on a doping profile of the diode.

For example, the first polysilicon stack 5 may be formed by doping an N type or P type ion into an undoped polysilicon layer through an ion implantation process. Alternatively, the first polysilicon stack 5 may be formed of an N type or P type doping layer through an in-situ deposition process.

The first polysilicon stack 5 may be formed in low pressure chemical vapor deposition (LPCVD) equipment, very low pressure CVD (VLPCVD) equipment, plasma-enhanced CVD (PECVD) equipment, ultrahigh vacuum CVD (UH-VCVD) equipment, rapid thermal CVD (RTCVD) equipment, atmosphere pressure CVD (APCVD) equipment, or the like.

Here, for clarity, the first polysilicon stack 5 is illustrated as an N type polysilicon layer, but the first polysilicon stack is not limited thereto.

That is, the ion implantation process for forming the PN diode may include an N− type ion implantation process and a P+ type ion implantation process. Alternatively, the ion implantation process for forming the NP diode may include a P− type ion implantation process and an N+ type ion implantation process.

Figure 3:
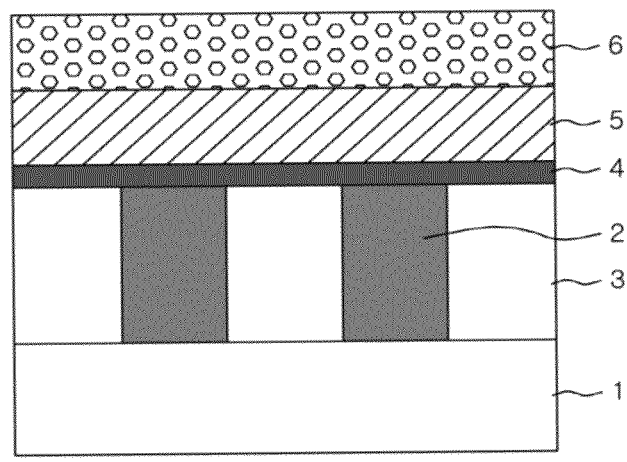

Referring to FIG. 3, a second polysilicon stack 6 is formed on the semiconductor substrate including the first polysilicon stack 5.

In one exemplary embodiment, the second polysilicon stack 6 may include a silicon carbon (SiC) layer or a carbon-based silicon layer.

By the formation of the second polysilicon stack 6, ion movement may be slowed or suppressed by the film quality characteristic of the second polysilicon stack 6, even when ions in the PN diode to be formed later are diffused by a thermal process.

That is, when the second polysilicon stack 6 includes a SIC layer, the film quality becomes dense due to a strong covalent bonding force between silicon (Si) and carbon (C) and ion movement is not facilitated due to a bonding structure and a lattice structure. Therefore, ion diffusion in the PN diode may be prevented by the formation of the second polysilicon stack 6. Even when the second polysilicon stack 6 includes a polysilicon layer containing carbon (C), the ion movement may be interfered or suppressed by the bonding structure between carbon (C) and silicon (Si).

In the related art, an undoped layer, which is an intermediate layer, is interposed to prevent the ions in the PN diode from being moved or diffused. However, mobility of the ions is increased during a rapid processing process at above a predetermined temperature. For example, at a high temperature, the ions are actively diffused. Therefore, the ions pass through the interposed layer and may be moved from the P-type layer to the N-type layer or from the N-type layer to the P-type layer. Thus, the leakage current may occur in the off current state due to the ion movement to degrade the off current characteristic.

However, in the exemplary embodiment, the second polysilicon stack 6 is formed to suppress thermal diffusion of ions even when the mobility of the ions is increased at a high temperature, which is above the predetermined temperature. Therefore, occurrence of the leakage current may be reduced in the off current state in the PN diode.

The second polysilicon stack 6 formed of a SIC layer is formed by implanting ions. Alternatively, the second polysilicon stack 6 may be formed by in-situ doping a carbon material into an undoped polysilicon layer as in forming the first polysilicon stack 5.

The second polysilicon stack 6 may be formed using LPCVD equipment, VLPCVD equipment, PECVD equipment, UH CVD equipment, RTCVD equipment, or APCVD equipment.

Figure 4:
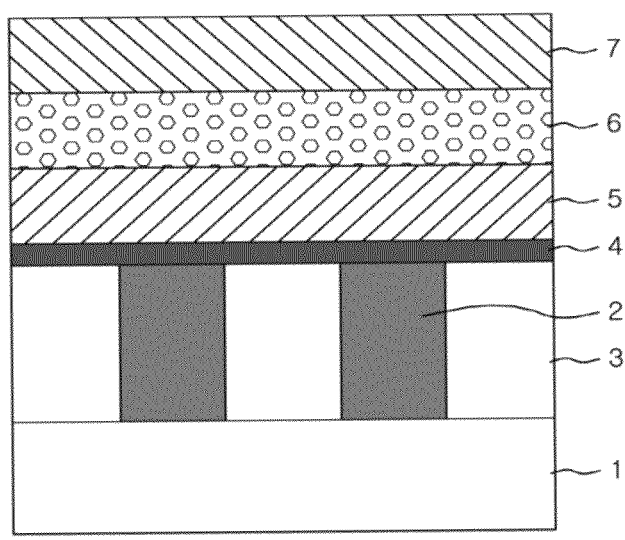

Referring to FIG. 4, a third polysilicon stack 7 is formed on the semiconductor substrate including the second polysilicon stack.

Here, the third polysilicon stack 7 is formed of a material having a conductivity type different the first polysilicon stack 5. For example, when the first polysilicon stack 5 includes an N-type material, the third polysilicon stack 7 includes a P-type material.

The third polysilicon stack 7 may be an upper conductive layer of the PN diode to be formed later.

For example, the t rd polysilicon stack 7 may be formed by implanting a P-type ion into an undoped polysilicon layer. Alternatively, the third polysilicon stack 7 may be formed of a P-type doping layer using an in-situ deposition process.

The third polysilicon stack 7 may be formed using LPCVD equipment, VLPCVD equipment, PECVD equipment, UHVCVD equipment, RTCVD equipment, or APCVD equipment.

Figure 5:
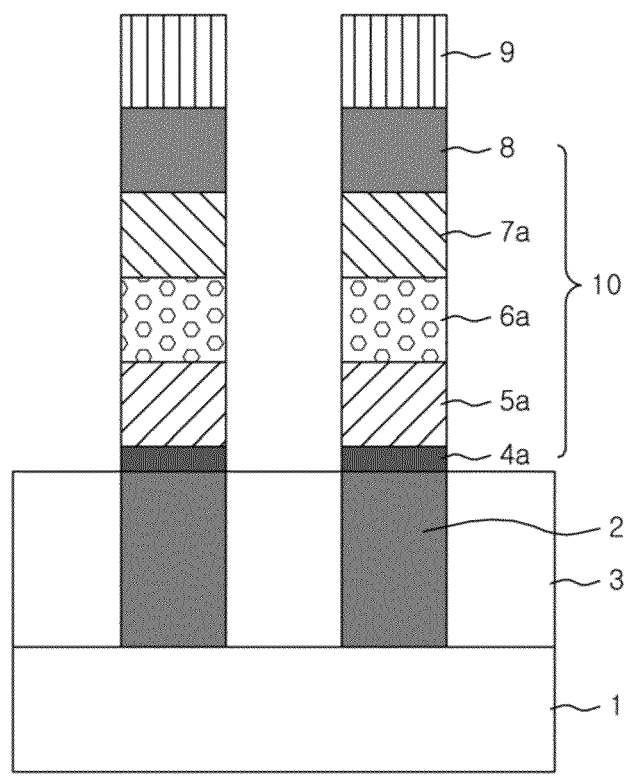

Referring to FIG. 5, a silicide layer (not shown) and a hard mask (not shown) are stacked and patterned to form a diode pillar pattern.

Specifically, a silicide layer (not shown) is formed on the semiconductor substrate including the third polysilicon stack 7.

The silicide layer is a layer for lowering a contact resistance of a GST lower electrode to be formed later and may be formed using titanium silicide ($TiSi_2$), cobalt silicide ($CoSi_2$) or nickel silicide ($NiSi_2$).

The silicide layer may be formed using sputtering, MOALD, PVD, CVD, or the like.

A hard mask layer (not shown) is formed on the silicide layer. The hard mask is a layer for etching and for defining a GST lower electrode region.

The stacked layers 4, 5, 6, 7 and the silicide layer are patterned using a hard mask pattern 9 to form a diode pillar pattern 10.

Although the diode pillar pattern 10 including a silicide layer pattern 8 is illustrated in FIG. 5, any stacking structure including a first polysilicon pattern 5a, a second polysilicon pattern 6a, and a third polysilicon pattern 7a may be applied to the diode pillar pattern 10.

A lower metal layer pattern 4a is a pattern in which the lower metal layer described above (see 4 of FIG. 2) is patterned and the hard mask pattern 9 is a pattern in which the hard mask is patterned. Therefore, a stacked type diode, that is, a vertical PN diode pattern is formed.

Figure 6:
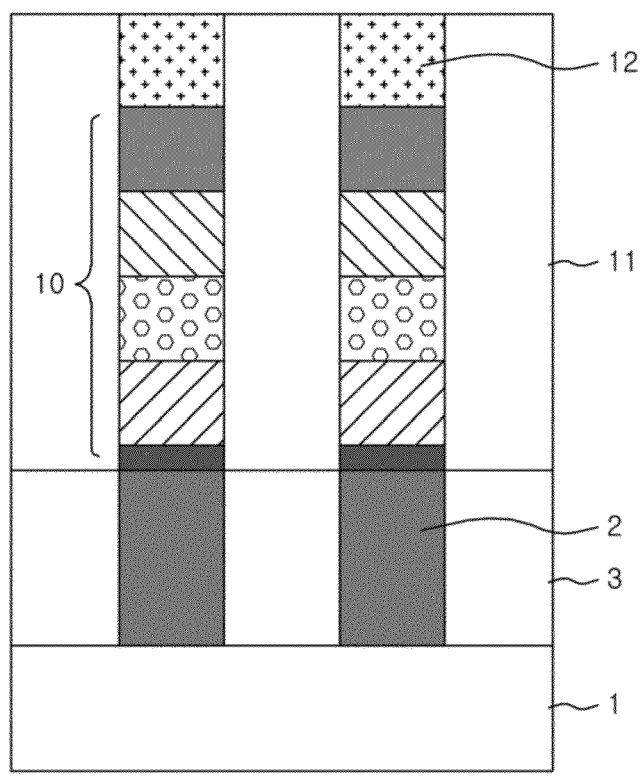

Referring to FIG. 6, a lower electrode is formed and therefore the PCRAM device is completed.

First, an insulating layer 11 is formed to be gap-filled between the island type diode pillar patterns 10 and between hard mask patterns 9.

That is, the insulating layer 11 is formed by burying an insulating material for gap-fill between the island type patterns 10 and between the hard mask patterns 9. The insulating layer 11 includes a layer, for example, flowable oxide among oxide materials such as borophosphosilicate glass (BPSG), HDP, or SDD/HDP.

Subsequently, the hard mask pattern 9 is removed.

The hard mask pattern 9 is selectively removed using a wet method or a dry method. This is fully understood by those skilled in the art, and thus, detailed description thereof will be omitted.

Then, a lower electrode 12 is formed in a region in which the hard mask pattern 9 is removed.

The lower electrode 12 may include a TiN-based conductive layer as well-known. That is, the lower electrode 12 may be formed of any one of Ti, TiN, and titanium aluminum nitride (TiAlN). Next, the PCRAM device is completed through subsequent processes.

As described above, according to the exemplary embodiment of the inventive concept, a SiC layer or a carbon based-silicon layer is interposed in the PN diode to suppress thermal diffusion of ions in the PN diode and to reduce leakage current.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A phase-change random access memory (PCRAM) device, comprising:
    a semiconductor substrate; and
    a PN diode formed on the semiconductor substrate and including a layer interposed therein to suppress thermal diffusion of ions,
    wherein the PN diode includes:
        a first polysilicon pattern layer having a first conductivity type material;
        a second polysilicon pattern layer formed on the first polysilicon pattern layer; and
        a third polysilicon pattern layer formed on the second polysilicon pattern layer and having a second conductivity type material.

2. The PCRAM device of claim 1, wherein the second polysilicon pattern layer comprising a silicon carbon (SiC) layer.

3. The PCRAM device of claim 1, wherein the second polysilicon pattern layer comprising a polysilicon layer containing carbon (C).

4. The PCRAM device of claim 1, wherein the second conductivity type material is a P type if the first conductivity type material is an N type, while the second conductivity type material is an N type if the first conductivity type is a P type.

5. A method of manufacturing a phase-change random access memory (PCRAM) device, the method comprising:
    providing a semiconductor substrate; and
    forming a PN diode pattern including a layer interposed therein to suppress thermal diffusion of ions, on the semiconductor substrate,
    wherein the forming a PN diode pattern includes:
        forming a first polysilicon layer is formed over the semiconductor substrate;
        forming a second polysilicon layer on the first polysilicon layer; and
        forming a third polysilicon layer on the second polysilicon layer.

6. The method of claim 5, wherein the second polysilicon layer comprising a silicon carbon (SiC) layer.

7. The method of claim 6, wherein the SiC layer is formed by ion-implanting a SiC material.

8. The method of claim 5, wherein the second silicon layer comprising a polysilicon layer including carbon (C).

9. The method of claim 8, wherein the polysilicon layer containing carbon (C) is formed by depositing a carbon material in an in-situ deposition method.

10. The method of claim 5, wherein forming a second polysilicon layer includes forming the second polysilicon layer by a method using low pressure chemical vapor deposition (LPCVD) equipment, very low pressure CVD (VLPCVD) equipment, plasma-enhanced CVD (PECVD) equipment, ultrahigh vacuum CVD (UHVCVD) equipment, rapid thermal CVD (RTCVD) equipment, or atmosphere pressure CVD (APCVD) equipment.

11. The method of claim 5, wherein forming a PN diode pattern includes patterning the first polysilicon layer, the second polysilicon layer, and the third polysilicon layer sequentially stacked to form a vertical type pattern.

12. The method of claim 5, wherein the third polysilicon layer includes a second conductivity type material if the first polysilicon layer includes a first conductivity type material.

13. The method of claim 12, wherein the second conductivity type material is a P type if the first conductivity type material is an N type, while the second conductivity type material is an N type if the first conductivity type material is a P type.

14. A phase-change random access memory (PCRAM) device, comprising:
    a semiconductor substrate; and
    a PN diode formed on the semiconductor substrate and including a layer interposed therein to suppress thermal diffusion of ions,
    wherein the layer includes a polysilicon layer containing a carbon (C) material.

15. The PCRAM device of claim 14, wherein the PN diode includes:
    an n-type polysilicon layer formed on the semiconductor substrate; and
    a p-type polisilicon layer formed over the n-type polysilicon layer,
    wherein the layer is formed between the n-type polysilicon layer and the p-type polysilicon layer.

16. The PCRAM device of claim 14, wherein the layer is silicon carbon layer.

* * * * *